(12) United States Patent
Komatsuzaki et al.

(10) Patent No.: US 11,367,588 B2
(45) Date of Patent: Jun. 21, 2022

(54) CHARGED PARTICLE BEAM DEVICE

(71) Applicant: Hitachi High-Tech Corporation, Tokyo (JP)

(72) Inventors: Ryo Komatsuzaki, Tokyo (JP); Atsushi Sawada, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 30 days.

(21) Appl. No.: 17/257,408

(22) PCT Filed: Jul. 25, 2018

(86) PCT No.: PCT/JP2018/027859
§ 371 (c)(1),
(2) Date: Dec. 31, 2020

(87) PCT Pub. No.: WO2020/021649
PCT Pub. Date: Jan. 30, 2020

(65) Prior Publication Data
US 2021/0272769 A1    Sep. 2, 2021

(51) Int. Cl.
*H01J 37/26* (2006.01)
*H01J 37/28* (2006.01)

(52) U.S. Cl.
CPC ............ *H01J 37/265* (2013.01); *H01J 37/28* (2013.01)

(58) Field of Classification Search
CPC .. H01J 37/00; H01J 37/02; H01J 37/26; H01J 37/265; H01J 37/28; H01J 37/24; H01J 37/22; H01J 37/222; H01J 37/244; H01J 37/261

USPC ................. 250/306, 307, 310, 311
See application file for complete search history.

(56) References Cited

U.S. PATENT DOCUMENTS

| | | | |
|---|---|---|---|
| 2009/0030867 A1 | 1/2009 | Hirai et al. | |
| 2012/0019648 A1 | 1/2012 | Hoshino et al. | |
| 2012/0153145 A1* | 6/2012 | Cheng | H01J 37/28 250/307 |
| 2018/0288865 A1* | 10/2018 | Aso | G21K 5/00 |

FOREIGN PATENT DOCUMENTS

| | | |
|---|---|---|
| JP | 5-299050 A | 11/1993 |
| JP | 2008-226536 A | 9/2008 |
| JP | 2009-32800 A | 2/2009 |
| JP | 2011-54286 A | 3/2011 |
| WO | WO 2010/084860 A1 | 7/2010 |

OTHER PUBLICATIONS

International Search Report (PCT/ISA/210) issued in PCT Application No. PCT/JP2018/027859 dated Oct. 16, 2018 with English translation (four (4) pages).

(Continued)

*Primary Examiner* — Jason L McCormack
(74) *Attorney, Agent, or Firm* — Crowell & Moring LLP

(57) ABSTRACT

An object of the present invention is to provide a charged particle beam device capable of easily and quickly calling a function required by a user on a GUI. A charged particle beam device according to the invention presents an operation component that is recommended to be provided on a component set according to an operation history of the charged particle beam device (see FIG. 5).

11 Claims, 13 Drawing Sheets

(56) References Cited

OTHER PUBLICATIONS

Japanese-language Written Opinion (PCT/ISA/237) issued in PCT Application No. PCT/JP2018/027859 dated Oct. 16, 2018 (six (6) pages).
Japanese-language International Preliminary Report on Patentability (PCT/IPEA/409) with Annexes issued in PCT Application No. PCT/JP2018/027859 dated Apr. 7, 2020 (11 pages).

* cited by examiner

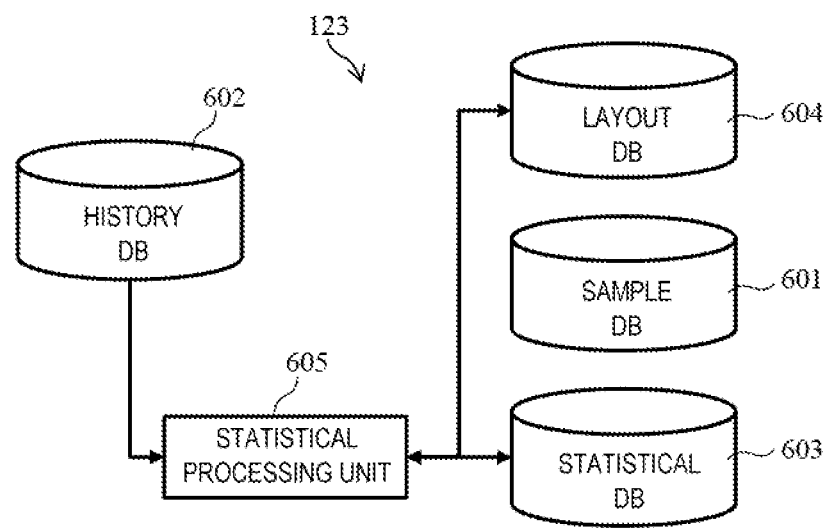

FIG. 8
| SAMPLE NAME | DATE AND TIME | FUNCTION | PARAMETER |
|---|---|---|---|
| SN1 | 20180307152534 | SAMPLE CHANGE | - |
| | 20180307152620 | E1 | X=10.025mm, Y=20.125mm |
| | 20180307152640 | E2 | - |
| | 20180307152654 | E3 | - |
| | 20180307152734 | IMAGE ACQUISITION | P1-1 |
| | ⋮ | ⋮ | ⋮ |
| | 20180309100310 | SAMPLE CHANGE | - |
| | 20180309100548 | E1 | X=31.231mm, Y=16.778mm |
| | 20180309101103 | E5 | X=172, Y=83 |
| | 20180309101127 | E4 | - |
| | 20180309101212 | IMAGE ACQUISITION | P1-2 |
| | ⋮ | ⋮ | ⋮ |
| SN2 | 20180307152534 | SAMPLE CHANGE | - |
| | 20180307152620 | E1 | X=2.233mm, Y=7.921mm |
| | 20180307152640 | E9 | - |
| | 20180307152654 | E2 | - |
| | 20180307152734 | IMAGE ACQUISITION | P2-1 |
| | ⋮ | ⋮ | ⋮ |
| ⋮ | ⋮ | ⋮ | ⋮ |
| IMAGE NUMBER | IMAGE | OBSERVATION CONDITION | | |
|---|---|---|---|---|
| | | OC1 | OC2 | ... |
| P1-1 |  | ×100 | 10kV | ... |
| P1-2 | 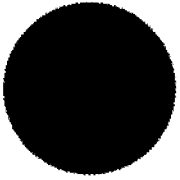 | ×150 | 5kV | ... |
| ⋮ | ⋮ | ⋮ | ⋮ | ... |

FIG. 9

Table 901:

| SAMPLE NAME | FUNCTION | NUMBER OF EXECUTION TIMES | NUMBER OF NEXT EXECUTION TIMES | | | |
|---|---|---|---|---|---|---|
| | | | E1 | E2 | E3 | ... |
| SN1 | E1 | 302 | 20 | 60 | 70 | ... |
| | E2 | 740 | 80 | 8 | 2 | ... |
| | E3 | 254 | 20 | 50 | 7 | ... |
| | ⋮ | ⋮ | ⋮ | ⋮ | ⋮ | |
| SN2 | E1 | 302 | 20 | 60 | 70 | ... |
| | E2 | 740 | 80 | 8 | 2 | ... |
| | E3 | 254 | 20 | 50 | 7 | ... |
| | ⋮ | ⋮ | ⋮ | ⋮ | ⋮ | ... |
| ⋮ | ⋮ | ⋮ | ⋮ | ⋮ | ⋮ | ⋮ |

Table 906:

| SAMPLE NAME | IMAGE NUMBER | EVALUATION VALUE | | |
|---|---|---|---|---|
| | | EV1 | EV2 | ... |
| SN1 | P1-1 | 64 | 90 | ... |
| | P1-2 | 68 | 85 | ... |
| | ⋮ | ⋮ | ⋮ | ... |
| | AVERAGE | 65 | 88 | ... |
| SN2 | P2-1 | 92 | 65 | ... |
| | P2-2 | 96 | 64 | ... |
| | ⋮ | ⋮ | ⋮ | ... |
| | AVERAGE | 93 | 62 | ... |
| ⋮ | ⋮ | ⋮ | ⋮ | ... |
| AVERAGE | | 80 | 70 | ... |

Table 910:

| SAMPLE NAME | NECESSITY | | |
|---|---|---|---|
| | E1 | E2 | ... |
| SN1 | 98 | 90 | ... |
| SN2 | 92 | 65 | ... |
| ⋮ | ⋮ | ⋮ | ... |

CHARGED PARTICLE BEAM DEVICE

TECHNICAL FIELD

The present invention relates to a charged particle beam device.

BACKGROUND ART

A charged particle beam device can perform various operations by combining functions to be performed on a sample. A parameter such as an observation condition at this time is called a recipe and the like. In general, trial and error is required to create an optimum recipe. On the other hand, a technique has been developed to support efficient creation of recipes.

The following PTL 1 describes a recipe for an observation device. In this document, an object is to "provide a recipe setting method for analyzing an existing recipe setting content without trial and error in an observation device even by a beginner and creating a new recipe in a short time based on an analysis result, and the observation device.", and a technique is disclosed of "an observation device having a function of, based on a recipe for which observation conditions are registered, observing a sample under the registered observation conditions, in which setting contents of a plurality of setting items are displayed in a list format for a plurality of recipes, and based on a result of analyzing commonality, a new recipe is created with setting contents having high commonality as initial settings." (see abstract).

CITATION LIST

Patent Literature

PTL 1: JP-A-2009-032800

SUMMARY OF INVENTION

Technical Problem

According to the technique described in PTL 1, an optimum recipe can be efficiently created. On the other hand, a user who uses a charged particle beam device may flexibly set an observation condition and an observation place by performing various functions manually or semi-automatically. In this case, the user does not necessarily perform a function according to the recipe, and manually calls various functions through, for example, a graphical user interface (GUI).

However, since the functions of the charged particle beam device are diverse, a screen configuration becomes complicated, and it is difficult to search for a desired function on the GUI when all the functions are displayed on the GUI. Although it is also conceivable to hierarchically organize and display a plurality of functions, in this case, not only the operation on the GUI until the desired function is reached is complicated, but also the user may not be aware of presence of functions that the charged particle beam device can execute. On the other hand, when a type of the function to be displayed on the GUI is limited, there is a possibility that the desired function cannot be executed via the GUI, and versatility of the charged particle beam device is reduced.

The invention has been made in view of the above problems, and an object thereof is to provide a charged particle beam device capable of easily and quickly calling a function required by a user on a GUI.

Solution to Problem

A charged particle beam device according to the invention presents an operation component that is recommended to be arranged on a component set in accordance with an operation history of the charged particle beam device.

Advantageous Effect

According to a charged particle beam device in the invention, in addition to being able to efficiently call a function useful for a user, it is possible to provide a simple GUI that does not display a function having low usability for the user. Accordingly, a throughput of work using the charged particle beam device can be improved.

BRIEF DESCRIPTION OF DRAWINGS

FIG. 6 is a diagram showing an example of a configuration of a database 123.

FIG. 7 is a diagram showing an example of a configuration of a sample database 601.

FIG. 8 is a diagram showing an example of a configuration of a history database 602.

FIG. 9 is a diagram showing an example of a configuration of a statistical database 603.

DESCRIPTION OF EMBODIMENTS

First Embodiment

Figure 1:
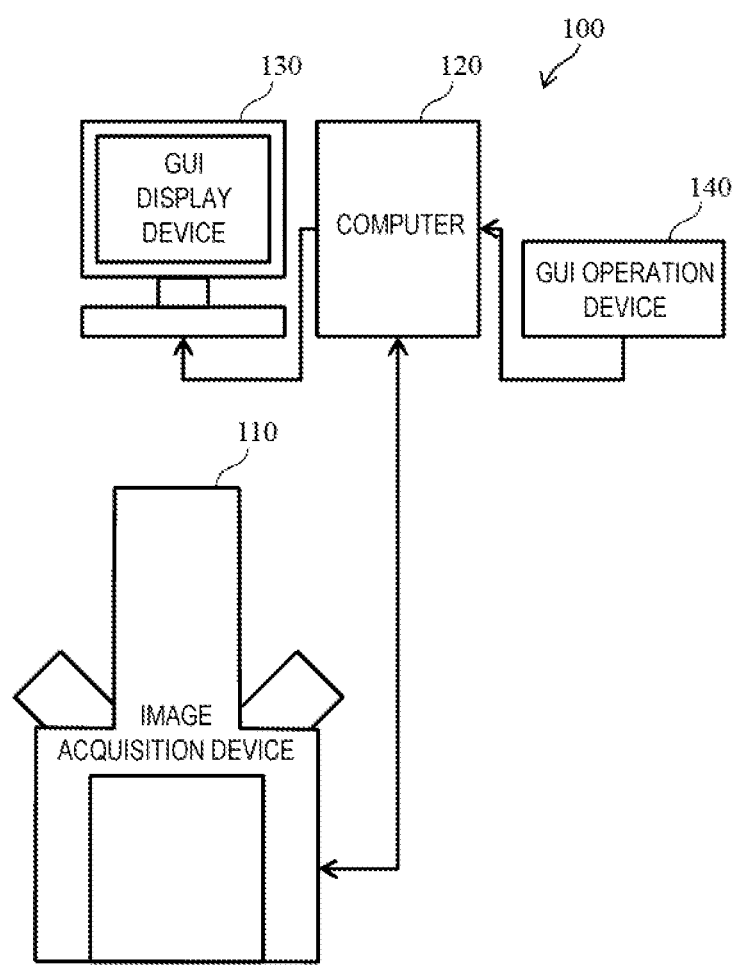
FIG. 1 is a configuration diagram of a charged particle beam device 100.

FIG. 1 is a configuration diagram of a charged particle beam device 100 according to a first embodiment of the invention. The charged particle beam device 100 is a device that irradiates a sample with a charged particle beam. Hereinafter, a device that acquires an observation image of a sample by irradiating the sample with a charged particle beam, such as a scanning electron microscope (SEM), will be described as an example.

The charged particle beam device 100 includes an image acquisition device 110, a computer 120, a GUI display device 130, and a GUI operation device 140. The image acquisition device 110 is a device (for example, SEM) that irradiates the sample with the charged particle beam. The computer 120 generates a GUI used by a user to operate the charged particle beam device 100, and outputs the generated GUI to the GUI display device 130. The GUI display device 130 is, for example, a display device, and displays the GUI on a screen. The GUI operation device 140 is, for example, a device used by the user to operate the computer 120, such as a keyboard or a mouse.

Figure 2:
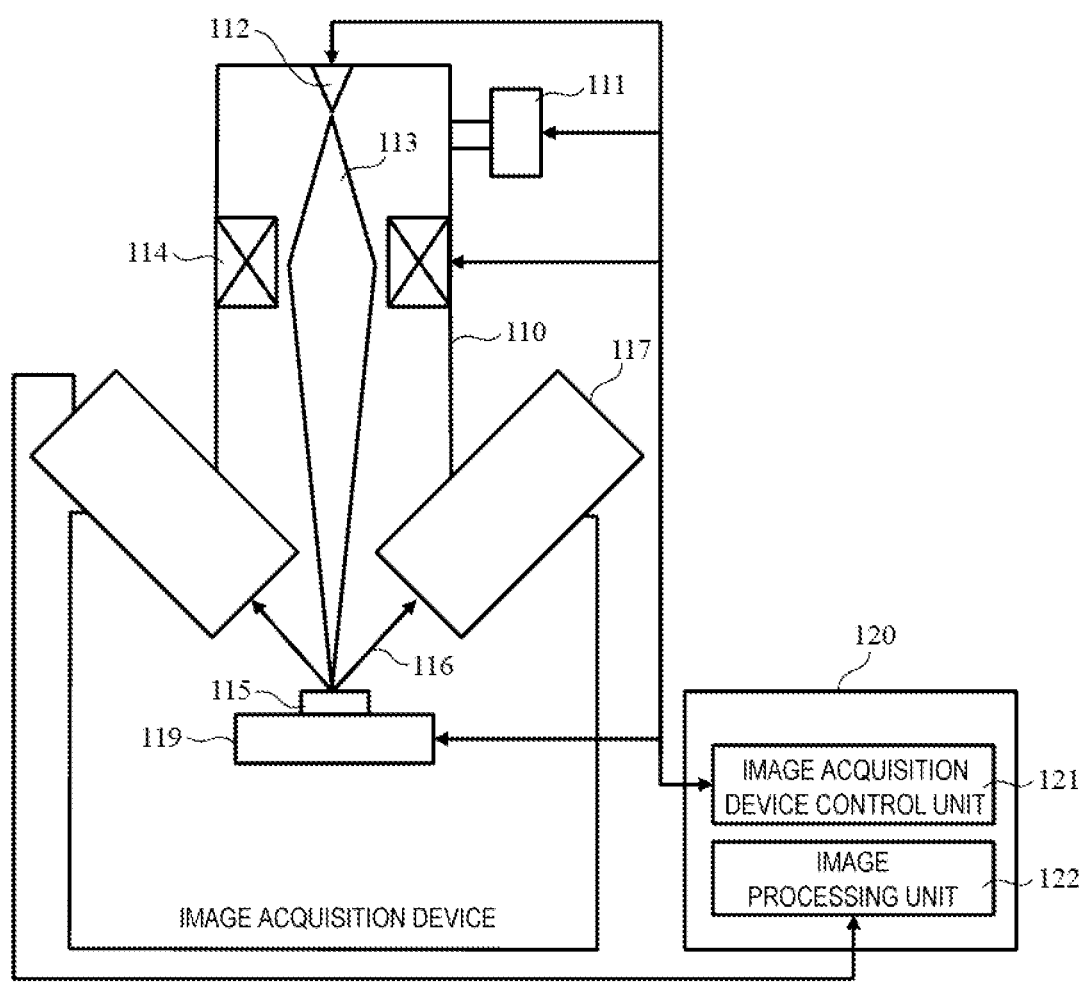
FIG. 2 is a diagram showing a configuration of an image acquisition device 110 and a connection between the image acquisition device 110 and a computer 120.

FIG. 2 is a diagram showing a configuration of the image acquisition device 110 and a connection between the image acquisition device 110 and the computer 120. A charged particle gun 112 generates a charged particle beam 113. The charged particle beam 113 converges to a sample 115 by passing through a lens 114. The lens 114 is, for example, a charged particle lens that deflects a charged particle beam, a charged particle lens that converges a charged particle beam, a charged particle lens that corrects astigmatism of a charged particle beam, or a combination thereof.

A detector 117 detects a charged particle 116 generated by irradiating the sample 115 with the charged particle beam 113, and outputs a detection result indicating the detection result (for example, a signal intensity of a secondary electron) to the computer 120. The computer 120 (image processing unit 122) generates an observation image of the sample 115 using the detection result. The detector 117 may be a detector that detects not only the charged particle but also an electromagnetic wave and light. Further, a plurality of detectors may be used.

The sample 115 is placed on a stage 119. An observation position of the sample 115 can be changed by moving the stage 119. An exhaust device 111 adjusts a degree of vacuum in a sample chamber by vacuum-evacuating the sample chamber that houses the sample 115 and the stage 119.

The computer 120 includes an image acquisition device control unit 121 and the image processing unit 122. The image acquisition device control unit 121 controls an operation of the image acquisition device 110. For example, the exhaust device 111, the charged particle gun 112, the lens 114, and the stage 119 are controlled.

Figure 3:
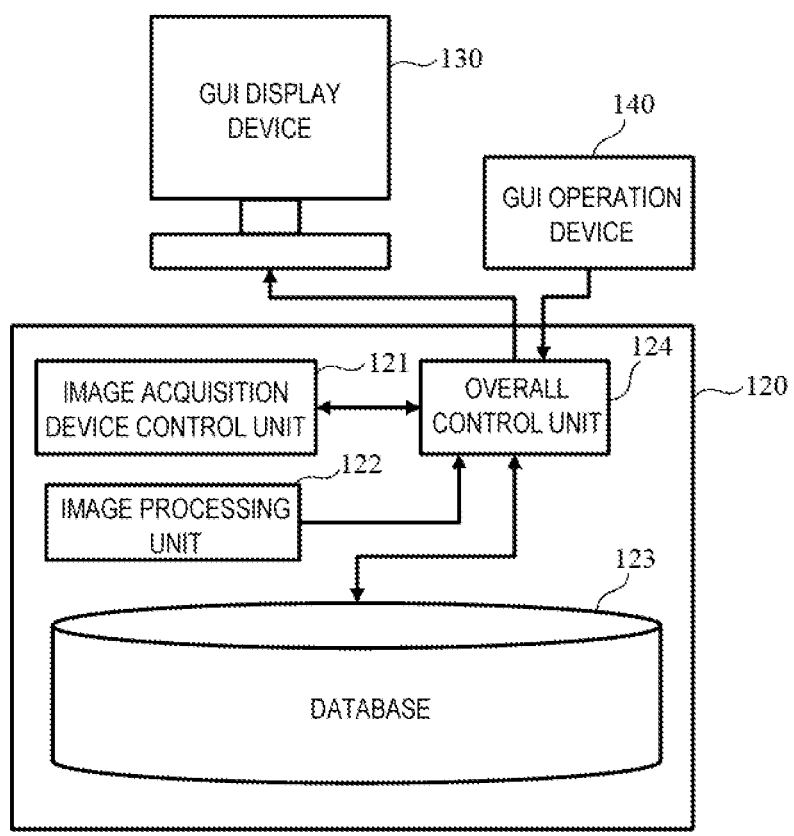
FIG. 3 is a configuration diagram of the computer 120.

FIG. 3 is a configuration diagram of the computer 120. The computer 120 includes a database 123 and an overall control unit 124 in addition to the image acquisition device control unit 121 and the image processing unit 122. The database 123 stores each data table to be described later. The database 123 can be formed, for example, by storing data describing a record on each data table in a storage device. The overall control unit 124 controls an overall operation of the computer 120. The overall control unit 124 reads and writes data from and to the database 123, generates a GUI to be described later, and outputs the generated GUI to the GUI display device 130. The overall control unit 124 controls the image acquisition device 110 in accordance with an operation of the user on the GUI via the image acquisition device control unit 121.

Figure 4:
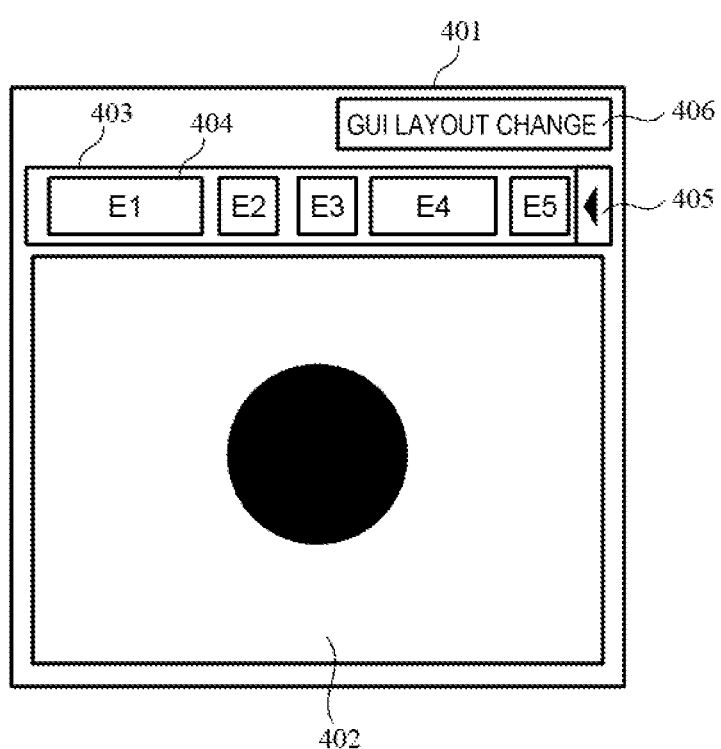
FIG. 4 shows an example of a screen configuration of an operation screen 401 provided by the computer 120.

FIG. 4 is an example of a screen configuration of an operation screen 401 provided by the computer 120. The computer 120 generates and outputs the operation screen 401 to the GUI display device 130, and the GUI display device 130 displays the operation screen 401 on a screen.

The operation screen 401 includes an observation image display column 402, a toolbar 403, and a layout change button 406.

The observation image display column 402 displays the observation image of the sample 115 generated by the image processing unit 122. The toolbar 403 is a component set in which operation components for calling the functions of the charged particle beam device 100 are collectively provided. The toolbar 403 further includes an all-element display button 405. When the all-element display button 405 is pressed, it is possible to display an operation component that cannot be displayed on the screen among the operation components provided in the toolbar 403. When the layout change button 406 is pressed, the computer 120 generates a layout change screen 501 to be described later with reference to FIG. 5, and outputs the generated layout change screen 501 to the GUI display device 130.

Figure 5:
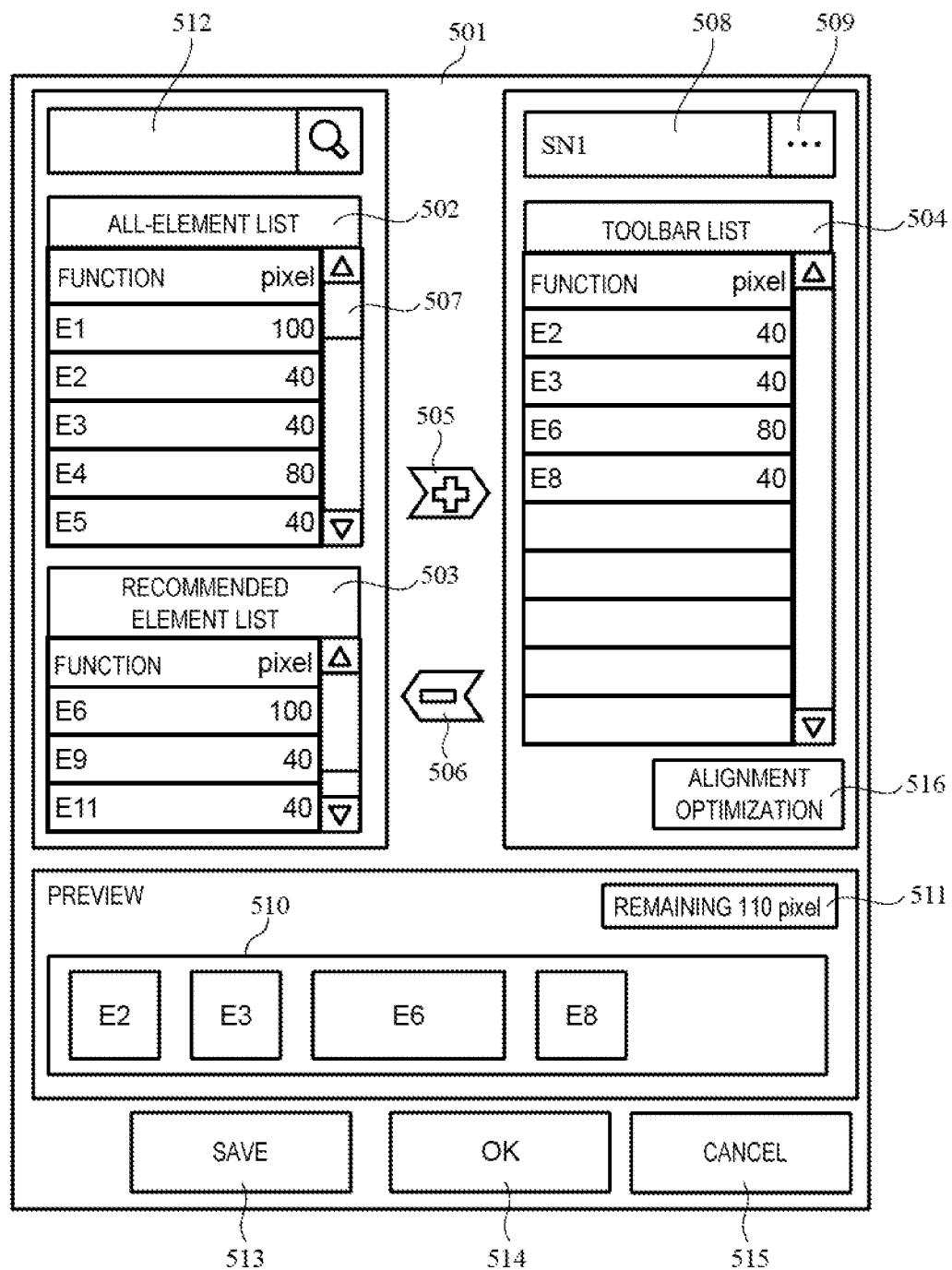
FIG. 5 shows an example of a screen configuration of a layout change screen 501.

FIG. 5 shows an example of a screen configuration of the layout change screen 501. The layout change screen 501 includes an all-element list 502, a recommended element list 503, and a toolbar list 504. The all-element list 502 is a list of all the operation components that can be provided on the toolbar 403. The recommended element list 503 is a list of the operation components that are recommended to be provided on the toolbar 403. A recommendation procedure will be described later. The toolbar list 504 is a list of the operation components determined to be provided on the toolbar 403.

The user selects the operation component to be arranged on the toolbar 403 in either of the all-element list 502 and the recommended element list 503, and presses an add button 505. Accordingly, the selected operation component is added to the toolbar list 504. When the user presses a delete button 506, the operation component selected on the toolbar list 504 is deleted from the toolbar list 504. A similar operation may be performed by dragging and dropping a mouse instead of pressing these buttons. A display position on each list can be changed by a scroll bar 507. An alignment sequence of the operation components on each list can be changed by performing dragging and dropping.

When the user presses a save button 513, the computer 120 stores the operation component on the toolbar list 504 and the alignment sequence thereof in the layout database 604 to be described later in association with a user definition name or a name of the sample 115. A layout name display unit 508 displays a current user definition name.

When the user presses a layout call button 509, the computer 120 displays a record of the layout database 604 to be described later on the screen, and the user can select a desired toolbar layout from the record. The toolbar list 504 is replaced by the toolbar layout selected by the user.

A preview display unit 510 displays an appearance when the operation component on the toolbar list 504 is provided on the toolbar 403 as a preview. A remaining size display unit 511 displays a size of a portion remaining on the toolbar 403 as a surplus region after providing the operation components on the toolbar list 504 on the toolbar 403. A screen size of the surplus region can be specified by accumulating a bitmap size when the operation components are provided. The user can also use a search box 512 to keyword search the operation component. A search result can be displayed in the all-element list 502 or a pop-up.

When the user presses an OK button 514, the computer 120 reflects a content of the toolbar list 504 on the toolbar 403. When the user presses a cancel button 515, the computer exits the layout change screen 501 without reflecting the content of the toolbar list 504 on the toolbar 403. An alignment optimization button 516 will be described later.

FIG. 6 is a diagram showing an example of a configuration of the database 123. The database 123 includes a sample database 601, a history database 602, a statistical database 603, and a layout database 604. A statistical processing unit 605 may be implemented as a function of the database 123 or may be implemented as a functional unit of the computer 120. For convenience, the function of the database 123 will be used. Each database will be described later with reference to FIG. 7 and subsequent figures. The statistical processing unit 605 performs statistical processing to be described later to update each database.

FIG. 7 is a diagram showing an example of a configuration of the sample database 601. The sample database 601 includes a sample table 701. The sample table 701 is a data table for storing information on each sample 115, and includes a sample name 702 and a thumbnail image 703 as data fields. The sample name 702 is a name defined by the user for each sample 115. As the thumbnail image 703, for example, one having the best image quality among the observation images to be described later can be selected. Specifically, one having the highest evaluation value 909 to be described later may be selected.

FIG. 8 is a diagram showing an example of a configuration of the history database 602. The history database 602 includes a history table 801. The history table 801 is a data table for recording a history of the function performed by the charged particle beam device 100. The functions described herein are not necessarily limited to those activated through the toolbar 403, and are all functions of the charged particle beam device 100 (or all functions that can be called via the toolbar 403).

A history table 801 includes a sample name 802, a date and time 803, a function 804, and a parameter 805 as data fields. The sample name 802 is a name of the sample 115. The date and time 803 is a time point of year, month and day when the function is performed, and the function 804 is a function name thereof. The parameter 805 is a parameter for performing the function 804. When the function 804 is in association with the observation image, an image number 807 to be described later may be recorded as the parameter 805.

The history database 602 further includes an image history table 806. The image history table 806 is a data table for recording a history of the observation image of the sample 115 acquired by the image acquisition device 110 and the computer 120. The image history table 806 includes the image number 807, an image 808, and an observation condition 809 as data fields. The image number 807 is an identification number of the observation image. An image 808 is image data of the observation image. The observation condition 809 is an observation condition (for example, an observation magnification or an acceleration voltage) set in the charged particle beam device 100 when the image 808 is acquired.

FIG. 9 is a diagram showing an example of a configuration of the statistical database 603. The statistical database 603 includes a frequency table 901. The frequency table 901 is a data table for recording a frequency statistic of the function performed by the charged particle beam device 100, and records a record obtained by aggregating the history table 801. The statistical processing can be performed by, for example, the statistical processing unit 605.

The frequency table 901 includes a sample name 902, a function 903, the number of execution times 904, and the number of next execution times 905 as data fields. The sample name 902 is a name of the sample 115. The function 903 is a function performed by the charged particle beam device 100. The number of execution times 904 is a total number of times the charged particle beam device 100 has executed the function 903. The number of next execution times 905 is a name and a total number of execution times of a function executed next to the function 903 that has been executed by the function 903. The function described herein is the same as that in the history table 801.

The statistical database 603 further includes an image evaluation value table 906. The image evaluation value table 906 is a data table for recording a quality evaluation value for each image stored in the image history table 806. The quality evaluation value can be calculated by the image processing unit 122 or the statistical processing unit 605, for example.

The image evaluation value table 906 includes a sample name 907, an image number 908, and an evaluation value 909 as data fields. The sample name 907 is a name of the sample 115. The image number 908 corresponds to the image number 807. The evaluation value 909 stores an evaluation value for each evaluation item of image quality. Examples of the evaluation items include sharpness, an SN ratio, and contrast. The higher the evaluation value 909, the better the image quality is.

The statistical database 603 further includes a necessity table 910. The necessity table 910 is a data table for storing a result of calculating a necessity 912 of the function of the charged particle beam device 100 for each sample name 911 and for each function in accordance with the frequency table 901 and the image evaluation value table 906. The necessity 912 can be calculated by the statistical processing unit 605, for example.

As a reference for calculating the necessity 912, for example, the following can be considered. Since the function 903 having the large number of execution times 904 is considered to be highly necessary, the necessity 912 can be increased as the number of times is larger. Apart from this, for those having a particularly low value among the evaluation values 909, the necessity 912 of the function 903 capable of increasing the evaluation value 909 thereof may be increased. For example, if the evaluation value 909 of the sharpness is low, the necessity 912 of an image sharpening function may be relatively higher than other functions. The final necessity 912 may be determined by, for example, weighting and adding the necessity calculated by these references.

Figures 10, 11:
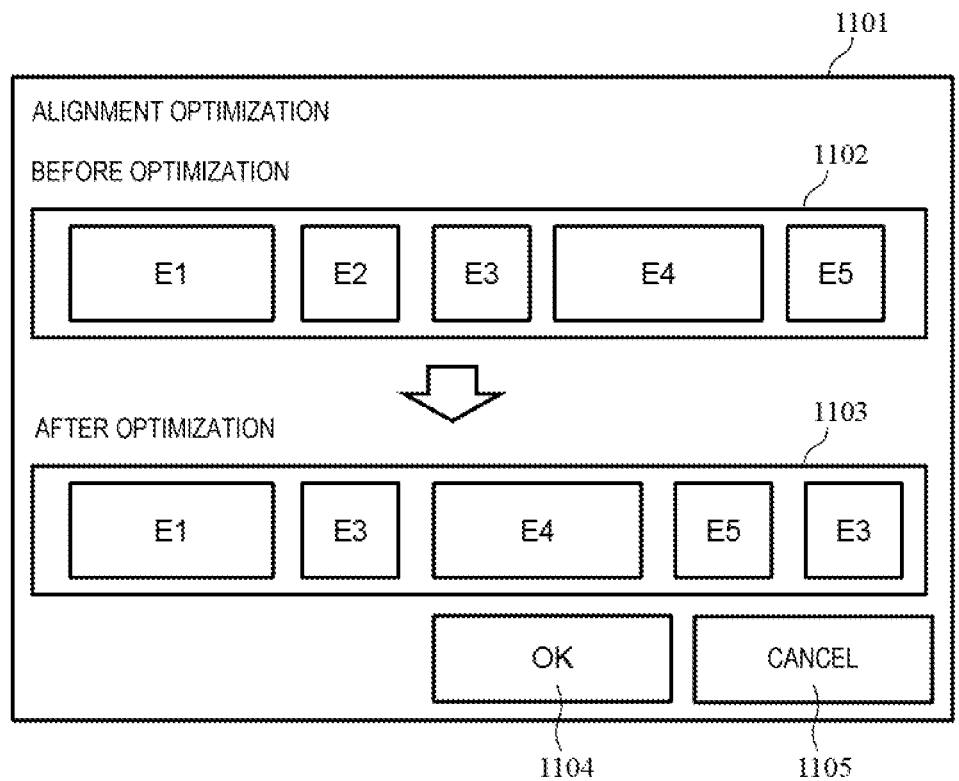
FIG. 10 is a diagram showing an example of a configuration of a layout database 604.
FIG. 11 shows an example of a screen configuration of an optimization checking screen 1101 presented by the computer 120 when an alignment optimization button 516 is pressed.

FIG. 10 is a diagram showing an example of a configuration of the layout database 604. The layout database 604 includes a layout table 1001. The layout table 1001 is a data table for recording a layout of the toolbar 403 set by the user on the layout change screen 501. The layout table 1001 stores a layout 1003 for each sample name 1002 or user definition name 1004. The layout 1003 described herein is an alignment sequence of the operation components on the toolbar list 504, and corresponds to an arrangement order of the operation components to be arranged in order from a left end of the toolbar 403 toward a right side.

First Embodiment: Proposal of Function to be Provided on Toolbar

In accordance with a record of the necessity table 910, the overall control unit 124 can present an operation component that is recommended to be provided on the toolbar 403 on the recommended element list 503. For example, a record corresponding to the current sample name 911 can be read from the necessity table 910, and can be arranged on the recommended element list 503 in descending order of the necessity 912.

First Embodiment: Alignment Optimization

FIG. 11 is an example of a screen configuration of an optimization checking screen 1101 presented by the computer 120 when the alignment optimization button 516 is pressed. When the alignment optimization button 516 is pressed, the overall control unit 124 optimizes the alignment sequence of the operation components on the toolbar list 504, and displays a result thereof on the optimization checking screen 1101.

The optimization checking screen 1101 includes a pre-optimization preview 1102 and a post-optimization preview 1103. The pre-optimization preview 1102 is a screen display preview of the toolbar 403 when the operation components are arranged on the toolbar 403 in accordance with the alignment sequence of the operation components on the toolbar list 504. The post-optimization preview 1103 is a screen display preview of the toolbar 403 after the alignment sequence is optimized. When the user presses an OK button 1104, the alignment sequence of the post-optimization preview 1103 is reflected on the toolbar 403, and when the user presses a cancel button 1105, the alignment sequence of the post-optimization preview 1103 is not reflected on the toolbar 403.

The overall control unit 124 can optimize the alignment sequence of the operation components on the toolbar list 504 in accordance with the record of the statistical database 603. For example, when there are functions that are frequently and consecutively executed next to the certain function 903 by referring to the function 903 and the number of next execution times 905, the functions are arranged adjacent to one another on the toolbar 403. For example, in an example in FIG. 9, it can be seen that a frequency at which a function E1 is executed next to a function E2 is relatively high. Accordingly, an operation amount on the operation screen 401 when the function is continuously executed can be reduced, so that the throughput of the charged particle beam device 100 is improved.

First Embodiment: Sample Change

Figure 12:
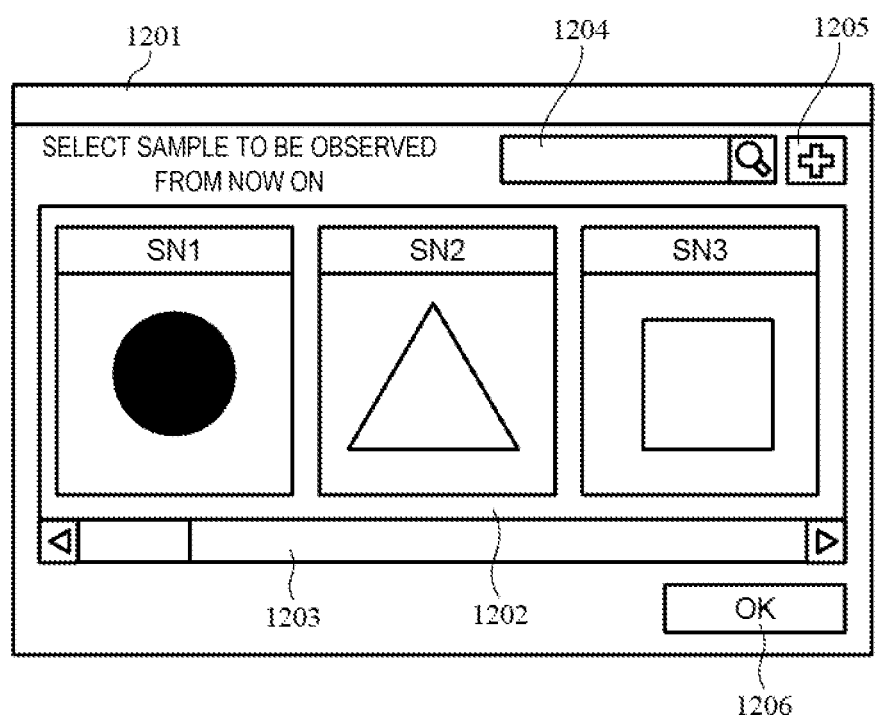
FIG. 12 shows an example of a screen configuration of a sample change screen 1201.

FIG. 12 is an example of a screen configuration of a sample change screen 1201. The sample change screen 1201 notifies the charged particle beam device 100 that the sample 115 is changed. In the first embodiment, an execution history of the function is recorded for each name of the sample 115, and further the functions to be arranged on the toolbar 403 and the alignment sequence are optimized for each name of the sample 115. Therefore, notifying that the sample 115 is changed is meaningful in instructing the charged particle beam device 100 to perform various processes corresponding to the changed sample 115.

The overall control unit 124 reads the sample name 702 and the thumbnail image 703 from the sample table 701 and displays the read sample name 702 and the thumbnail image 703 on a list 1202. By selecting any sample from the list 1202, the user can notify the charged particle beam device 100 that the sample 115 is changed to the selected sample. By sliding a scroll bar 1203, other samples that do not fit in the list 1202 can be displayed.

The user can use a search box 1204 to specify the sample name 702. A record on the sample table 701 corresponding to the specified sample name 702 is displayed on the list 1202. When the user presses an add button 1205, the overall control unit 124 adds a record including the sample name 702 input to the search box 1204 to the sample table 701. When the user presses an OK button 1206, the charged particle beam device 100 (specifically, the computer 120) is notified that the sample 115 has been changed to the sample selected on the list 1202.

First Embodiment: Summary

The charged particle beam device 100 according to the first embodiment records the history of executing the function in the history database 602, and recommends the operation component to be provided on the toolbar 403 in accordance with the history. This not only assists in customizing the toolbar 403, but also can make it possible to utilize a useful function of the charged particle beam device 100 that the user is unaware of. It is difficult for the user to select what is necessary from a large number of function groups, but the first embodiment can effectively support this. Since operation efficiency is increased by optimizing the operation component on the toolbar 403, the throughput of the charged particle beam device 100 can be improved.

The charged particle beam device 100 according to the first embodiment recommends the operation component to be provided on the toolbar 403, instead of specifying a function to be continuously executed like a recipe function. Therefore, since the user does not necessarily need to execute the function in accordance with the alignment sequence on the toolbar 403, a function execution sequence can be changed flexibly. Accordingly, it is possible to maintain high versatility while enhancing efficiency by recommending the operation component.

The charged particle beam device 100 according to the first embodiment can receive, via the sample change screen 1201, a notification that the sample 115 is changed. Therefore, the user can visually select the sample. Accordingly, the efficiency is improved as compared with a case where the sample is selected by a character, so that the time required for sample selection can be shortened.

Second Embodiment

In order for the image acquisition device 110 and the computer 120 to acquire an observation image of the sample 115, a certain processing time may be required. In a second embodiment of the invention, an operation example in which a user performs various operations on a screen using the processing time will be described. A configuration of the charged particle beam device 100 is the same as that according to the first embodiment.

Figure 13:
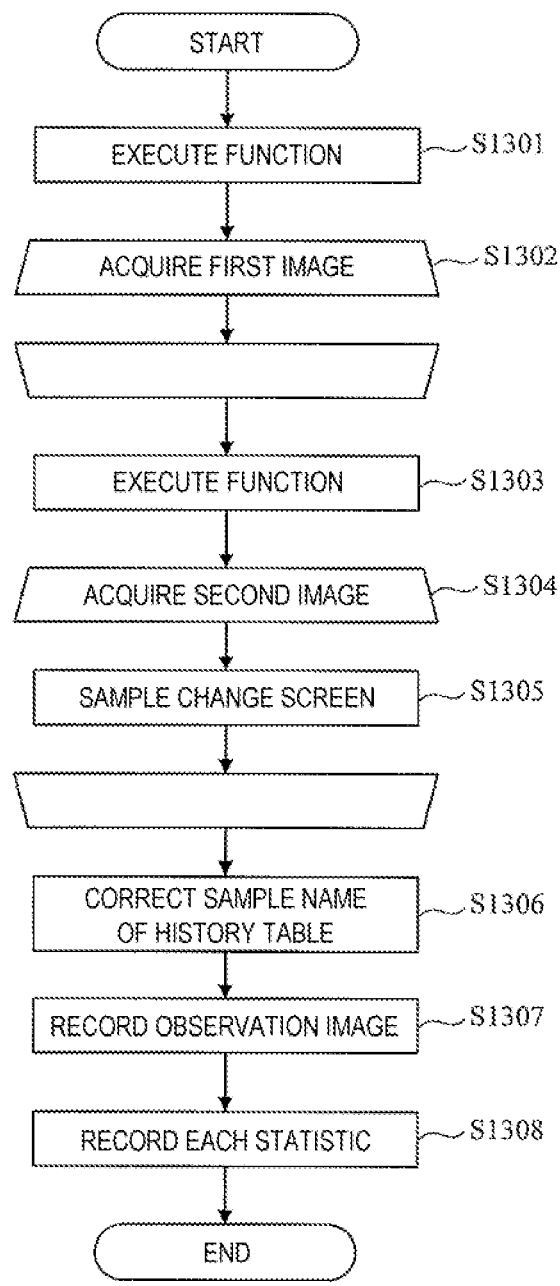
FIG. 13 is a flowchart showing an operation in which the charged particle beam device 100 acquires an observation image of a sample 115 twice.

FIG. 13 is a flowchart showing an operation in which the charged particle beam device 100 acquires the observation image of the sample 115 twice. Here, it is assumed that an observation position is changed by moving the stage 119 with respect to the same sample 115, and the observation image at each observation position is acquired. Hereinafter, each step in FIG. 13 will be described.

(FIG. 13: Steps S1301 and S1302)

The user executes various functions such as setting the observation condition 809 at the current sample 115 and the observation position (S1301). The image acquisition device 110 and the computer 120 acquire the observation image of the sample 115 (S1302). Here, it is assumed that the user specifies a name of the current sample 115 in step S1301.

(FIG. 13: Steps S1303 and S1304)

The user moves the stage 119 to change the observation position, and executes the various functions in the same manner as in step S1301 (S1303). The image acquisition device 110 and the computer 120 acquire the observation image of the sample 115 at the observation position after the movement (S1304).

(FIG. 13: Step S1305)

In view of a fact that step S1304 requires a certain amount of time, the user calls the sample change screen 1201 until step S1304 is completed. The user sets a new name of the sample 115 on the sample change screen 1201. For example, a sample name indicating that the observation position has been changed is set on the same sample.

(FIG. 13: Step S1305: Supplement)

Figure 14:
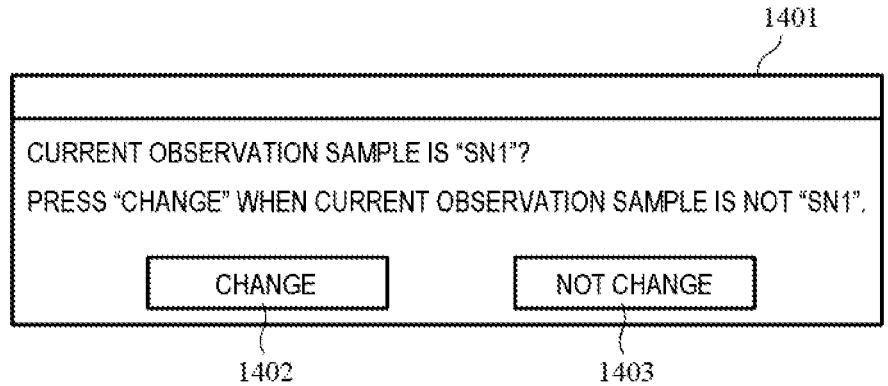
FIG. 14 shows an example of a screen configuration when a checking dialog is displayed in step S1305.

Generally, it can be said that a target for acquiring the observation image is often changed every time the observation image is acquired once. In this flowchart, the observation image is already acquired in step S1302. Therefore, it is considered that the sample name input in this step is intended for the user to be associated with the observation image acquired in step S1304. The computer 120 executes the following steps accordingly. In this step, a checking dialog as shown in FIG. 14 to be described later may be displayed.

(FIG. 13: Step S1306)

When the overall control unit 124 records the function performed between steps S1303 and S1305 in the history table 801, the sample name 802 among those records is replaced with the sample name input in step S1305. This is because these functions have been performed on the sample corresponding to step S1304.

(FIG. 13: Steps S1307 and S1308)

The overall control unit 124 records the observation images acquired so far in the image history table 806 (S1307), and updates each table of the statistical database 603 (S1308).

FIG. 14 is an example of a screen configuration when the checking dialog is displayed in step S1305. A checking dialog 1401 includes a change button 1402 and a cancel button 1403. When the user presses the change button 1402, step S1306 and subsequent steps are performed. When the user presses the cancel button 1403, step S1306 is skipped, and step S1307 and the subsequent steps are performed.

According to the second embodiment, it is possible to effectively use the time required for acquiring the observation image. Specifically, in order to acquire the observation image, it is necessary to integrate signals from the detector 117 and perform various image processes for acquiring a low-noise image. Since these processes require a certain amount of time, the time can be effectively utilized according to the second embodiment.

Third Embodiment

The image acquisition device 110 vacuum-exhausts a sample chamber by the exhaust device 111. Vacuum exhaust is a function that requires a certain amount of time, and requires even more time depending on performance of the exhaust device 111. In a third embodiment of the invention, an operation example in which a user performs various operations on a screen using the exhaust time will be described. A configuration of the charged particle beam device 100 is the same as that according to the first embodiment.

Figure 15:
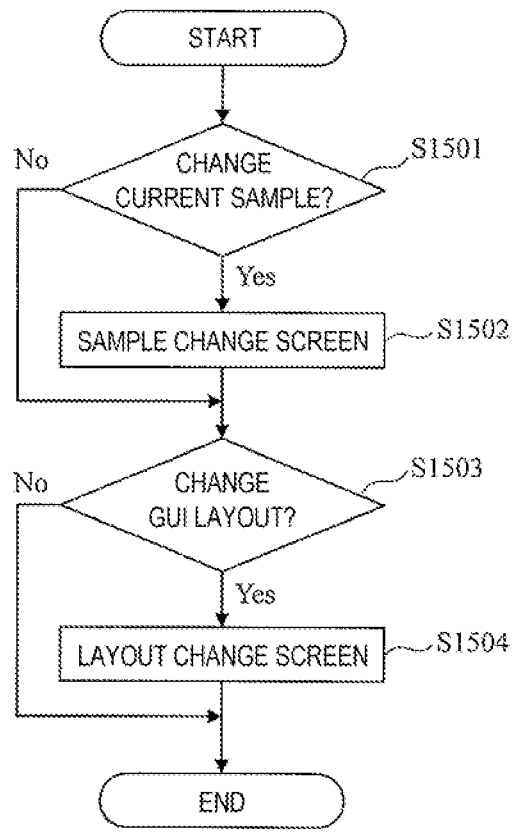
FIG. 15 is a flowchart showing an operation procedure when the charged particle beam device 100 vacuum-evacuates a sample chamber.

FIG. 15 is a flowchart showing an operation procedure when the charged particle beam device 100 vacuum-evacuates the sample chamber. When the exhaust device 111 starts vacuum-evacuation, the computer 120 starts the flowchart. Hereinafter, each step in FIG. 15 will be described.

(FIG. 15: Step S1501)

The computer 120 displays a dialog similar to the checking dialog 1401 on a screen. This step is meaningful in prompting a user to check whether the sample name currently used by the computer 120 and the actual sample 115 correspond to each other. When the user presses a change button, the process proceeds to step S1502, and when the user presses a cancel button, the process proceeds to step S1503.

(FIG. 15: Step S1502)

The computer 120 displays the sample change screen 1201 on the screen. The user changes the sample name on the same screen.

(FIG. 15: Step S1503)

The computer 120 displays a checking dialog 1601 to be described later with reference to FIG. 16 on the screen. When the user presses the change button on the same dialog, the process proceeds to step S1504, and when the user presses the cancel button, the flowchart ends.

(FIG. 15: Step S1504)

The computer 120 displays the layout change screen 501 on the screen. The user changes an operation component to be provided on the toolbar 403 on the same screen. The computer 120 can also recommend the operation component to be provided on the toolbar 403 on the same screen.

Figure 16:
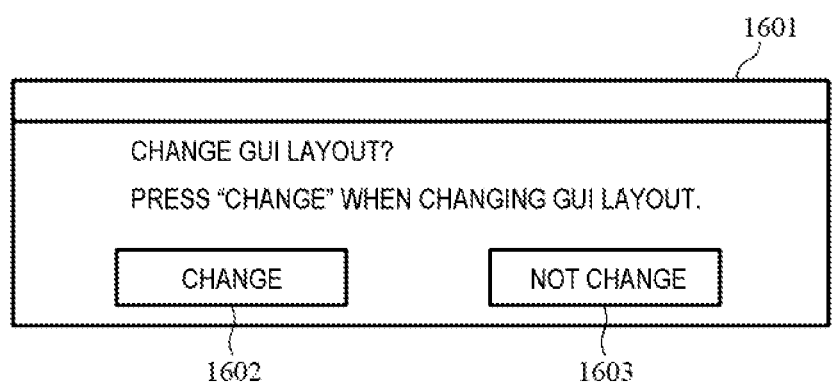
FIG. 16 shows an example of a screen configuration of a checking dialog 1601 displayed in step S1503.

FIG. 16 is an example of a screen configuration of the checking dialog 1601 to be displayed in step S1503. The checking dialog 1601 includes a change button 1602 and a cancel button 1603.

According to the third embodiment, it is possible to effectively use the time required for vacuum-evacuating a sample chamber. Since it is often a timing to replace the sample 115 that the sample chamber is vacuum-evacuated, it is necessary to change the sample name and a layout of the toolbar 403 accordingly. By performing this during a vacuum-evacuating time, a waiting time for vacuum-evacuation can be effectively used.

Modification of Invention

The invention is not limited to the embodiments described above, and includes various modifications. For example, the above-described embodiments have been described in detail for easy understanding of the invention, and are not necessarily limited to those having all the configurations described above. A part of the configuration according to one embodiment can be replaced with the configuration according to another embodiment, and the configuration according to one embodiment can be added to the configuration according to another embodiment. A part of the configuration according to each embodiment can be added, deleted, or replaced with another configuration.

In the above-described embodiments, each device is not necessarily mounted as a separate device, and may be implemented by a device having a plurality of functions or a combination thereof. For example, the GUI display device 130 and the GUI operation device 140 may be implemented by a device having both a display function and an operation function, such as a touch panel.

In the above-described embodiments, the database 123 may be stored inside the computer 120, or may be used by the computer 120 by forming a database on an external storage device.

The operation components provided in the toolbar 403 can be of any type, as long as the operation components are capable of calling the functions of the charged particle beam device 100. For example, a button, a slider, a check box, and a text box can be considered. A component set provided in the operation screen 401 is not necessarily limited to a toolbar, and may be, for example, a panel or a tab in which the operation components are aggregated. That is, in a case where a display area size on the operation screen 401 is limited, the invention can be applied as long as the operation component to be displayed on a screen is selected according to a history.

Although a configuration example in which an observation image is acquired by irradiating the sample 115 with an electron beam is described in the above embodiment, the invention can also be applied to operation components arranged on the toolbar 403 in other types of charged particle beam devices.

Although a sample name is changed when the observation image is acquired in the second embodiment, the same process can be performed in other types of charged particle beam devices. For example, in a case of a focused ion beam (FIB) device, when the sample name is changed after some functions are executed between a time when the sample 115 is irradiated with FIB and a time when the sample 115 is next irradiated with FIB, the changed sample name is considered to correspond to second FIB irradiation. Therefore, in FIG. 13, if a step of acquiring an observation image is replaced with FIB irradiation, the same operation as that according to the second embodiment can be performed.

The above-described configurations, functions, processing units, processing sections, and the like may be implemented by hardware by designing a part or all of the configurations, functions, processing units, processing sections, and the like with, for example, an integrated circuit. The above-described configurations, functions, and the like may also be implemented by software by means of interpreting and executing a program, by a processor, for implementing the functions. Information of programs, tables, files or the like for implementing each function can be stored in a recording device such as memory, hard disk, and solid state drive (SSD), or a recording medium such as an IC card and an SD card. Control lines or information lines indicate what is considered necessary for description, and not all the control lines or information lines are necessarily shown in a product. In practice, it may be considered that almost all the configurations are connected to one another.

REFERENCE SIGN LIST

100: charged particle beam device
110: image acquisition device
111: exhaust device
112: charged particle gun
113: charged particle beam
114: lens
115: sample
116: charged particle
117: detector
119: stage
120: computer
121: image acquisition device control unit
122: image processing unit
123: database
124: overall control unit
130: GUI display device
140: GUI operation device
403: toolbar
502: all-element list
503: recommended element list
504: toolbar list
510: preview display unit
511: remaining size display unit
516: alignment optimization button
601: sample database
602: history database
603: statistical database
604: layout database
605: statistical processing unit

The invention claimed is:

1. A charged particle beam device that irradiates a sample with a charged particle beam, the charged particle beam device comprising:
   a computer configured to provide a screen interface for inputting an operation specifying an operation of the charged particle beam device, wherein
   the computer provides, on the screen interface, a component set in which one or more operation components for specifying an operation to be performed by the charged particle beam device are arranged side by side,
   the charged particle beam device is configured to acquire an observation image of the sample by irradiating the sample with the charged particle beam,
   the computer includes a storage device that stores a history of performing the operation and a history of an evaluation value indicating quality of the acquired observation image, and
   the computer presents the operation component that is recommended to be provided on the component set based on at least one of the history of performing the operation and the history of the evaluation value.

2. The charged particle beam device according to claim 1, wherein
   the computer calculates the evaluation value for a plurality of items, and
   the computer recommends that the operation component specifying the operation capable of improving the evaluation value for an item having a lower evaluation value among the plurality of items be provided on the component set in preference to other operation components.

3. The charged particle beam device according to claim 1, wherein
   the storage device stores the history of performing the operation and the history of the evaluation value for each identifier of the sample,
   the computer includes a sample specification interface for receiving a sample specification of specifying the identifier of the sample, and
   the computer presents the operation component that is recommended to be provided on the component set in accordance with the history of performing the operation and the history of the evaluation value which correspond to the identifier of the sample specified by the sample specification interface.

4. A charged particle beam device that irradiates a sample with a charged particle beam, the charged particle beam device comprising:
   a computer configured to provide a screen interface for inputting an operation specifying an operation of the charged particle beam device, wherein
   the computer provides, on the screen interface, a component set in which one or more operation components for specifying an operation to be performed by the charged particle beam device are arranged side by side, the computer includes a storage device that stores a history of performing the operation, the computer presents the operation component that is recommended to be provided on the component set based on the history, the computer calculates a screen size that is occupied on the component set when the operation component is provided on the component set, the computer generates a preview of the component set by temporarily providing the operation component on the component set, and the computer calculates, using the screen size, a size of a surplus portion in which the operation component is not provided on the preview, and presents the calculated size of the surplus portion on the preview.

5. The charged particle beam device according to claim 1, wherein the computer presents the operation component that is recommended to be provided on the component set in a period from when the charged particle beam device starts irradiation with the charged particle beam to when the charged particle beam device finishes the irradiation with the charged particle beam.

6. The charged particle beam device according to claim 1, wherein during an intermediate period from completion of a first irradiation period during which the charged particle beam device emits the charged particle beam to completion of a second irradiation period during which the charged particle beam device emits the charged particle beam, the computer records the operation performed during the intermediate period in the storage device in association with the second irradiation period when the operation is performed.

7. The charged particle beam device according to claim 6, wherein the storage device records the history for each identifier of the sample, the computer includes the sample specification interface for receiving the sample specification of specifying the identifier of the sample, and when the sample specification is received via the sample specification interface during the intermediate period, the computer records the operation performed during the intermediate period in the storage device in association with the identifier of the sample specified in the sample specification.

8. The charged particle beam device according to claim 1, further comprising:

an exhaust device configured to vacuum-exhaust an inside of the charged particle beam device, wherein the computer presents the operation component that is recommended to be provided on the component set during a period while the exhaust device is performing the vacuum exhaust.

9. The charged particle beam device according to claim 1, wherein the charged particle beam device acquires the observation image of the sample by emitting an electron beam as the charged particle beam and scanning a position at which the sample is irradiated with the electron beam.

10. The charged particle beam device according to claim 3, wherein the computer displays the observation image corresponding to each identifier of the sample on the sample specification interface.

11. The charged particle beam device according to claim 10, wherein the computer selects the observation image to be displayed on the sample specification interface based on the evaluation value.

* * * * *